United States Patent [19]

Frisch et al.

[11] Patent Number: 4,707,834
[45] Date of Patent: Nov. 17, 1987

[54] COMPUTER-BASED INSTRUMENT SYSTEM

[75] Inventors: Arnold M. Frisch, Portland; Allen L. Hollister; Larry L. Hutchinson, both of Beaverton, all of Oreg.

[73] Assignee: Tektronix, Inc., Beaverton, Oreg.

[21] Appl. No.: 777,104

[22] Filed: Sep. 17, 1985

[51] Int. Cl.$^4$ ............................................. G06F 11/00
[52] U.S. Cl. .................................. 371/20; 371/16; 324/73 R; 364/200
[58] Field of Search .................... 371/16, 20, 25, 18, 371/21, 27; 324/73 R, 73 AT; 364/200, 900

[56] References Cited

U.S. PATENT DOCUMENTS

| | | | |
|---|---|---|---|
| 4,334,307 | 6/1982 | Bourgeois | 371/16 |
| 4,339,819 | 7/1982 | Jacobson | 371/16 |
| 4,538,268 | 8/1985 | Pham Van Cang | 371/20 |
| 4,551,837 | 11/1985 | Goegelein | 371/20 |
| 4,590,550 | 5/1986 | Eilert | 371/16 |
| 4,604,744 | 8/1986 | Littlebury | 371/20 |
| 4,606,024 | 8/1986 | Glass | 371/16 |
| 4,611,281 | 9/1986 | Suko | 371/16 |

Primary Examiner—Michael R. Fleming

Attorney, Agent, or Firm—Daniel J. Bedell; George T. Noe; Robert S. Hulse

[57] ABSTRACT

A computer-based instrument system is provided for progammably configuring a variety of computer-based test instruments for performing a variety of tests and permitting high speed execution of tests through concurrent operation of individual test instruments. The instruments are implemented on circuit boards and mounted in a chassis including permanent backplane wiring interconnecting the instruments and a timing and triggering control unit. The backplane wiring includes a conventional computer bus for carrying instructions from a master controller to each instrument and lines for a common system clock signal, protocol signals, and trigger signals between selected instruments and the timing and triggering control unit for synchronizing the operation of the instruments when performing a test. The timing and triggering control unit is adapted to programmably control instrument triggering according to individual test requirements without modification of backplane wiring. The backplane wiring further includes a high speed data bus for rapidly transferring data between instruments in the course of a test.

18 Claims, 13 Drawing Figures

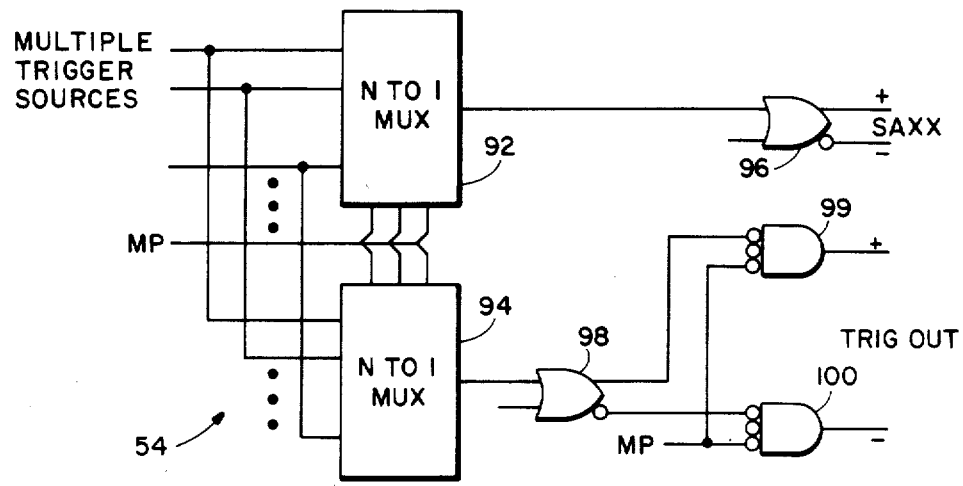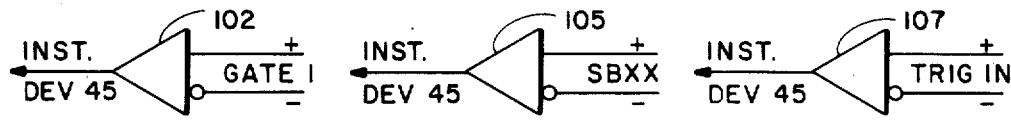
FIG. 6
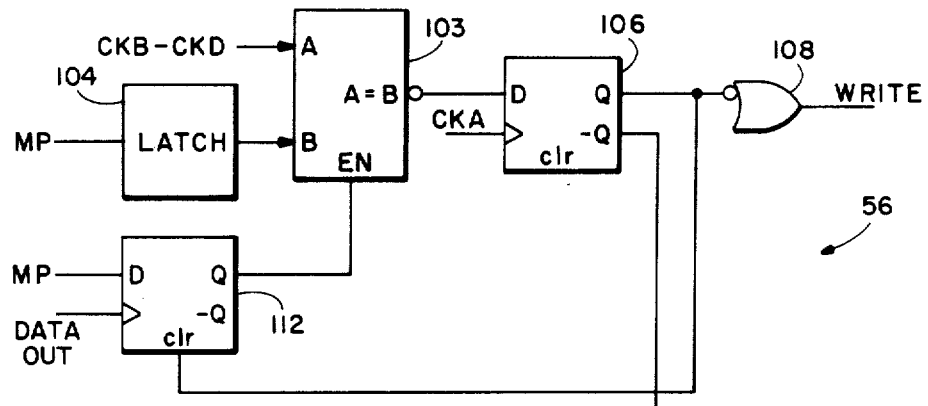
FIG. 7
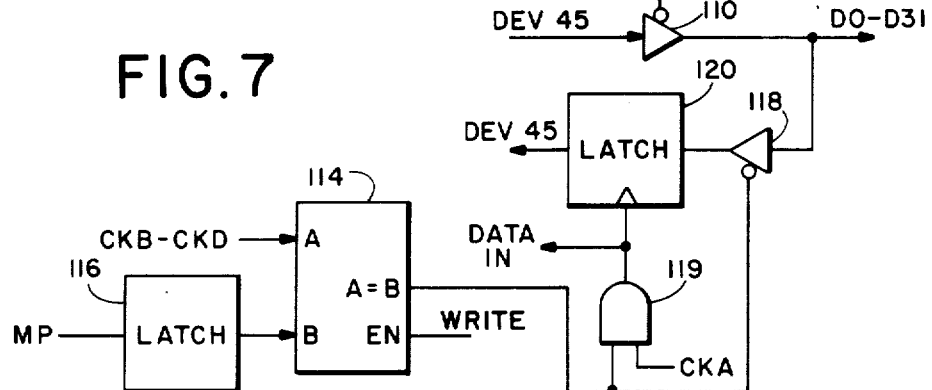

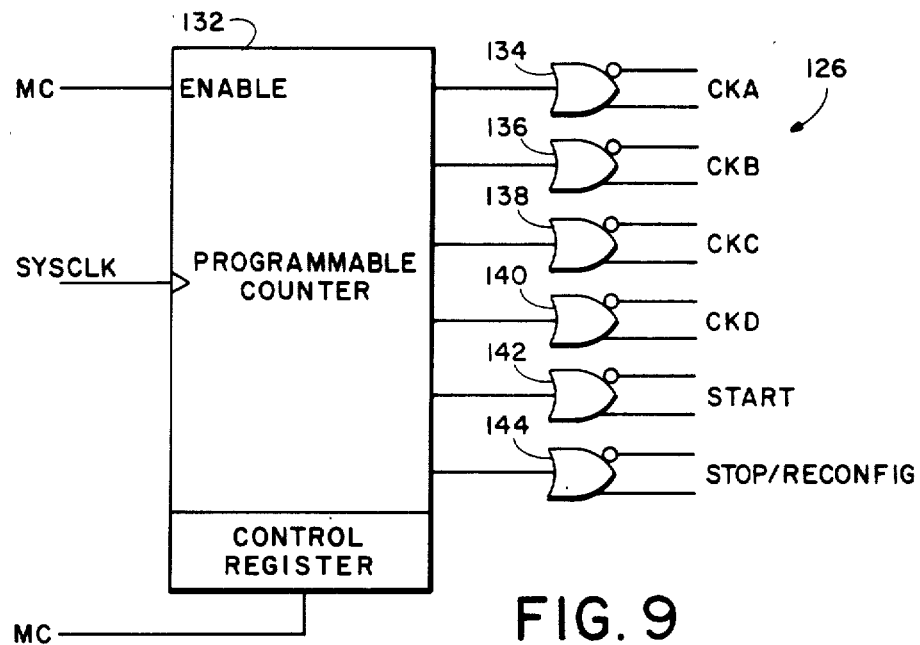
FIG. 9
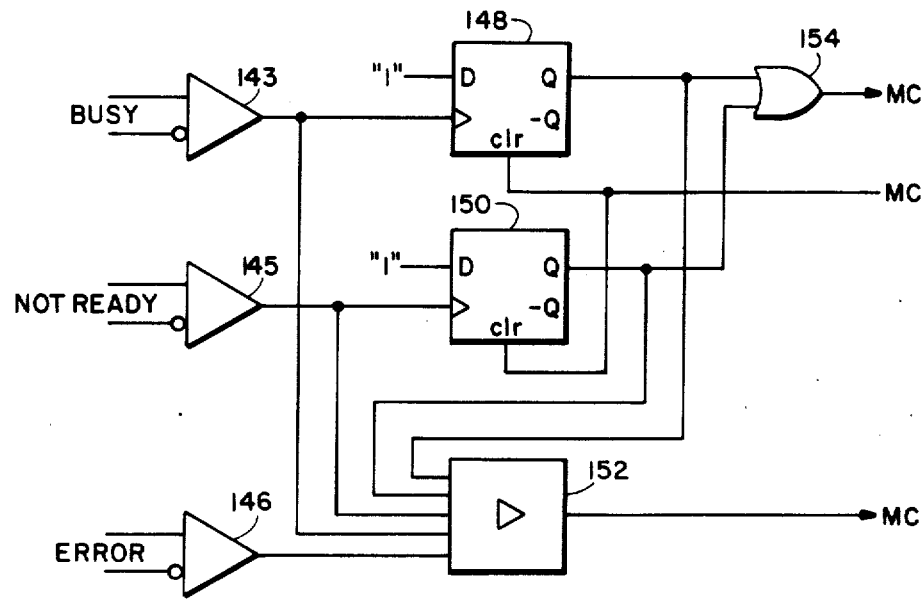

{ 4,707,834 }

COMPUTER-BASED INSTRUMENT SYSTEM

BACKGROUND OF THE INVENTION

This invention relates in general to computer-based electronic instruments and more particularly to a method and apparatus for controlling and coordinating the operation of several such instruments.

In recent years microcomputer-based electronic equipment has been developed for performing various test, control, computation and other functions according to stored instruction sets. The use of microprocessors in, for instance, test instruments allows instrument settings to be changed during tests without human intervention, thereby accelerating test procedures in which instrument settings must be changed many times. Microcomputer-based test instruments also typically provide for storage of acquired test data in random access memories, for manipulation and display after a test is complete, thereby freeing operators from the task of monitoring data displays during the test and writing down test results.

Many electronic equipment tests, computations, control functions or the like involve the use of more than one instrument and difficulties often arise in coordinating their operation. For instance, a digital-to-analog converter (DAC) is often tested by applying a known digital quantity as an input to the DAC, sampling and digitizing the DAC output, and then comparing the digitized output with the input. The process is typically repeated for many different input quantities to test the DAC over its fully input range. The use of a microcomputer-based pattern generator to produce sequences of inputs and a computer-based digitizer to sample and store the resulting sequence of outputs can speed up the testing process since the operator need not change the pattern generator output or write down the digitizer output after each test. However, to test the speed of the DAC, the digitizer must sample the output of the converter at a selected time after the converter input has changed. Therefore the operation of the pattern generator and the digitizer must be synchronized. In the past, the pattern generator has been adapted to produce a trigger signal when it has changed its output pattern, and that trigger signal was applied to the digitizer through an appropriately adjusted time delaying device to initiate sampling. The digitizer is adapted to produce another trigger signal when it has completed sampling and digitizing of the converter output. That trigger signal is applied to the pattern generator to initiate generation of the next output pattern.

This traditional approach to coordinating test instrument operation requires instruments to be interconnected by temporary wiring, employing timers, counters and other logic devices in a fashion dictated by the requirements of the particular test to be performed. Such temporary interfacing of equipment is often difficult and time-consuming to install, unsightly and unreliable. What is needed is an apparatus permitting precise time coordination of the operation of many different computer-based test instruments or other equipment in the performance of a wide variety of test, control, computation or other functions without requiring installation of custom interconnect equipment and wiring to coordinate instrument operation.

Some procedures requiring more than one instrument involve the transfer of data between instruments. For instance, one computer-based test instrument may repeatedly acquire and pass test data to another instrument which uses it in some fashion to control a real-time function which must be synchronized with the operation of the first instrument. In order to perform in this way, it is necessary not only that the operation of the separate instruments be synchronized, but also the data must be transferred rapidly so as to avoid impeding the real-time operation of the instruments. It would be useful to have an apparatus which would not only synchronize the operation of separate instruments but would provide high-speed data transfer between such instruments.

SUMMARY OF THE INVENTION

According to one aspect of the invention, a plurality of computer-based instruments (and/or other equipment) are mounted on printed circuit boards and installed in a common chassis which interconnects the instruments through common backplane wiring. A master controller is connected to the chassis by a conventional computer bus carried to each instrument as a part of the backplane wiring. The master controller stores and then transmits test or other procedure instructions to each instrument over the computer bus system, permitting each instrument to be configured to perform a particular procedure from a common location. This common bus reduces the requirement for physical access by an operator to each instrument, permits a reduction in the total amount of operator interface equipment required to access the instruments, and provides for rapid programming of each instrument.

According to another aspect of the invention, the instruments are also interconnected to a master timing, triggering and control (TTC) unit, mounted in the chassis, by trigger input and output lines on the chassis backplane. Some trigger lines are connected in parallel to each instrument and others are connected separately between the TTC and each instrument. The TTC unit includes multiplexers, a timer and other programmable logic devices for transmitting trigger output signals to the instruments over the trigger lines, the trigger output signals being derived from selected combinations of trigger input signals from the instruments according to instructions received from the master controller over the computer bus system. The TTC unit and the trigger lines provide a flexible, yet permanently wired, means for triggering the instruments.

According to a further aspect of the invention, the chassis backplane includes control wiring, connected in parallel to the TTC unit and each instrument, for carrying a system clock signal generated by the TTC unit for synchronously starting and clocking the operation of each instrument, along with various control and indication signals generated by the TTC or the instruments in order to control various reconfiguration operations of the separate instruments.

According to a still further aspect of the invention, selected instruments are also interconnected by a data bus, carried on the chassis backplane, providing high speed data communication between instruments. The TTC includes means for generating timing signals carried on the backplane to each instrument for arbitrating the use of the high speed bus.

The computer-based instrument system of the present invention thus provides for rapid, reliable configuration of a variety of test instruments or the like to perform selected procedures and permit high speed execution of these procedures through concurrent operation of individual instruments, through closely synchronizing the operation of individual instruments, and through rapid transfer of data between instruments.

It is accordingly an object of the invention to provide a new and improved system for programming and coordinating the operation of computer-based test, control or computational devices and related equipment.

It is another object of the invention to provide a system wherein such instruments may be rapidly configured and easily monitored from a common point of operator interface.

It is a further object of the invention to provide such a system having means for flexibly configuring trigger signals between concurrently operating instruments without modifying interconnecting wiring.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DESCRIPTION OF THE DRAWINGS

FIG. 6 is a schematic diagram of the strobe signal interface section of the FIG. 3 circuit;

FIG. 7 is a schematic diagram of the high speed data bus interface section of the FIG. 3 circuit;

FIG. 9 is a combined block and schematic diagram of the protocol generator of the FIG. 8 unit;

DETAILED DESCRIPTION

Figure 1:
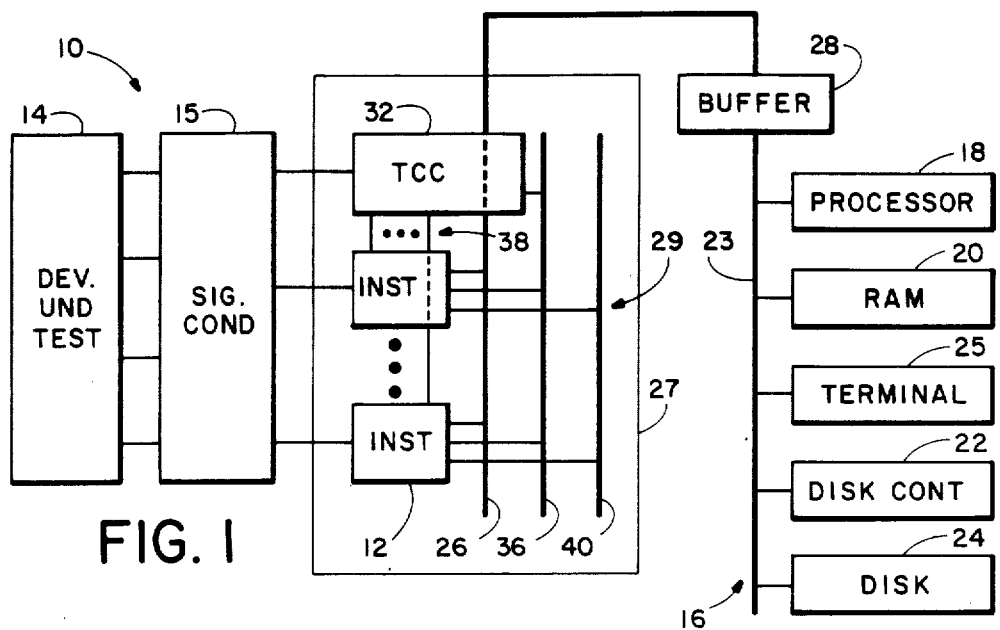
FIG. 1 is a block diagram of a computer-based instrument system according to the present invention.

Referring to FIG. 1, depicted in block diagram form is an embodiment of a computer-based instrument system 10 according to the present invention which is adapted to coordinate the operation of a plurality of computer-based instruments 12 for performing test, computational or control functions. In the particular embodiment shown, the system 10 is adapted to coordinate selected instruments 12 in the testing of an electronic device 14. However, it is understood that in other embodiments of the invention any or all of the instruments 12 may include controllers, computers, array processors, or other computer-based equipment for performing other than test functions.

In the particular embodiment of the invention depicted in FIG. 1, signals transmitted between the test instruments 12 and the device under test 14 are conditioned by conventional signal conditioning circuits 15 in a manner appropriate to the requirements of each instrument. Instruments 12 may, for example, comprise waveform generators, digitizers, logic analyzers and the like capable of performing selected test functions wherein adjustment of instrument settings, starting and stopping of selected test operations, storage and manipulation of acquired data, etc., are controlled by an internal microcomputer according to a set of stored instructions.

According to the present invention, the instructions for each such instrument 12 are initially stored in a master controller 16 suitably comprising a Motorola 68000 series microcomputer system using the VME standard computer bus arrangement, including a processor 18, a random access memory (RAM) 20, a disk controller 22, a disk or other bulk storage device 24, and a terminal 25 for user access. The processor 18, RAM 20, disk controller 22, and terminal 25 are all interconnected by a conventional computer bus 23 including data, address and control lines.

The instruments 12 are each implemented on printed circuit boards adapted for mounting in parallel slots of a chassis 27 having backplane wiring 29 interconnecting the slots. A portion of the chassis backplane wiring 29 includes an extension 26 of the computer bus 23 connected thereto through a bus extension buffer 28. Each instrument 12 is connected in parallel to the computer bus 26 through edge connectors on the instrument circuit board when the instrument is plugged into a chassis slot, thereby providing a communication path between each instrument's internal microcomputer and the master controller 16.

System 10 further includes a triggering, timing and control (TTC) unit 32, also implemented on a circuit board mounted in a slot of chassis 27 and accessed by the computer bus 26. The backplane wiring 29 of the chassis additionally includes a parallel control bus 36 having lines connecting the TTC unit 32 in parallel to each instrument 12, and a distributed control ("star") bus 38, having lines separately connecting the TTC unit to each instrument 12.

The parallel control bus 36 carries the following signals:

SYSCLOCK: This is a continuous 100 MHZ clock signal generated by the TTC unit 32 and transmitted to the instruments 12 for synchronizing the operation of each instrument.

STOP/RECONFIG: This signal is asserted by the TTC unit 32 and transmitted to each instrument 12, indicating that each instrument may prepare the instrument to perform another test sequence, for instance, by acquiring new instructions from the master controller 16 or by branching to a new set of instructions previously acquired from the master controller.

NOT READY: Each instrument 12 asserts this signal following receipt of the STOP/RECONFIG signal and then deasserts it when the instrument is reconfigured and ready to perform a next test procedure according to its stored instructions.

START: The TTC unit transmits this signal to each test instrument 12 to initiate a test procedure after detecting that all of the instruments have deasserted the NOT READY signal. Following receipt of the START signal, each instrument 12 initiates its assigned portion of the test procedure on the next falling edge of the SYSCLOCK signal. This enables all instruments to start test operations at the same instant.

BUSY: Each instrument 12 asserts this signal after receiving the START signal and continues to assert the BUSY signal until it has completed its portion of the test procedure according to its stored test instructions. When the BUSY signal is no longer asserted by any instrument, the TTC unit 32 initiates the STOP/RECONFIG signal.

ERROR: This signal may be asserted by any instrument 12 following detection of an error, for instance, in the data acquired from the master controller or in the course of executing a test procedure. The instrument later deasserts the ERROR signal following receipt of the STOP/RECONFIG signal from the TTC unit 32. The TTC unit 32 and each instrument 12 may be programmed to branch to error handling subroutines if the STOP/RECONFIG signal is asserted while the ERROR signal is asserted.

TRIG OUT: Any instrument 12 may transmit this signal to the TTC unit 32 when the instrument has detected a selected triggering event in the course of performing a test function.

TRIG IN: The TTC unit 32 transmits this signal in common to every instrument 12 to initiate a preprogrammed response in one or more of the instruments 12 in the course of performing a test procedure.

GATE1, GATE2: These signals are transmitted by the TTC unit 32 in common to each instrument 12 and may be utilized by any instrument to gate the TRIG OUT or qualify the TRIG IN signals, or for any other selected purpose.

The star bus 38 comprises lines carrying the following signals:

SAxx: An instrument 12 may be configured to transmit this signal to the TTC unit 32 when it has detected a selected triggering event in the course of performing a test procedure. (The "xx" in the signal pneumonic represents a unique two-digit number denoting the instrument's chassis slot).

SBxx: The TTC unit 32 may be programmed to transmit this signal to the corresponding instrument 12 to trigger a programmed response in the instrument in the course of performing a test function.

The blackplane wiring of chassis 27 also includes a high speed data bus 40 interconnecting each instrument slot to permit high speed transfer of data between selected instruments 12. In the preferred embodiment of the invention, the high speed data bus is a 32 bit wide, emitter-coupled logic bus and is utilized for transfer of large memory arrays or to make a virtual hardware connection between instruments, thereby permitting real-time coordination of the instruments when transfer of data between the instruments is required. The following five additional signals are carried by the parallel bus 36 to control the timing of data transfers on the high speed bus 40:

CKB, CKC, CKD: Selected instruments 12 may be programmed to transmit or receive data on the high speed bus 40 during any one of eight time slots.

The CKB, CKC and CKD signals, generated by the TTC unit 32, comprise a three-bit count synchronized to the system clock which indicates the current high speed data bus time slot.

CKA: This is a 50 MHz square wave clock signal generated by the TTC unit 32 on assertion of the START signal and continuing until assertion of the STOP signal. Each transmitting instrument 12 monitors the CKA clock signal, and when the CKA pulse is high, transmits a data word on the high-speed bus 40 in its assigned time slot following the next trailing edge of the SYSCLK signal.

WRITE: Each transmitting instrument 12 asserts this signal to indicate to a receiving instrument that it is currently transmitting data on the high-speed bus 40.

Figure 2:
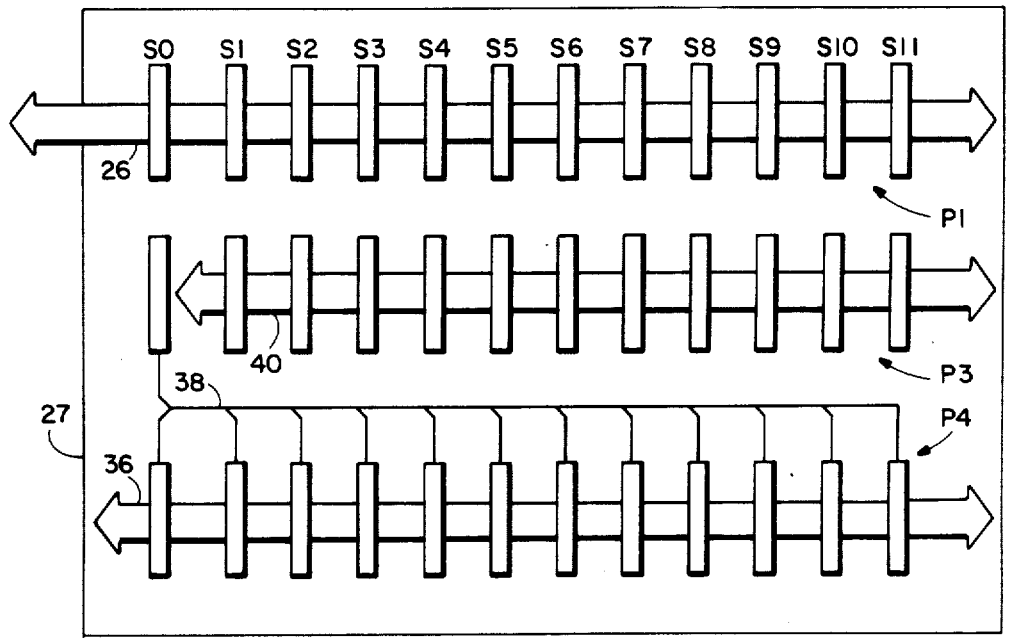
FIG. 2 is a diagram of the physical layout of the backplane of the instrument system chassis of FIG. 1.

Referring to FIG. 2, each instrument 12 circuit board is connected to the backplane wiring of chassis 27 by three connectors, P1, P3 and P4. Connector P1 connects the instrument 12 to the computer bus 26, connector P3 connects the instrument to the high speed data bus 40, and connector P4 connects the instrument to the parallel control bus 36 and to the star bus 38. The backplane has connector slots, numbered from S0 to S11, and instrument boards may be mounted in any slot except slot S0. Slot S0 is reserved for the TTC unit 32. The TTC unit 32 also has three connectors P1, P3 and P4, but while P1 connects the TTC unit to the computer bus 26, and P4 connects the unit to the parallel control bus 36, connector P3 connects the TTC unit to the star bus 38 lines from each of the P4 connectors of instrument slots S4–S11. In addition, the star bus lines from connectors P4 of slots S1–S3 are connected to the TTC unit through spare pins on connector P4 of the TTC unit. The TTC unit 32 does not access the high speed data bus 40.

The following tables list the pin arrangements for the backplane connectors P1, P3 and P4 for the instrument boards and the TTC unit board. The VME bus signals carried on the P1 connector are well-known in the art and are not further detailed herein. The signals carried on the connectors P3 and P4 are as described hereinabove.

TABLE I

| | P1 CONNECTOR PINOUT | | |
|---|---|---|---|
| PIN | ROW A | ROW B | ROW C |
| 1 | D00 | BBSY* | D08 |
| 2 | D01 | BCLR* | D09 |
| 3 | D02 | ACFAIL* | D10 |
| 4 | D03 | BGOIN* | D11 |
| 5 | D04 | BGOOUT* | D12 |
| 6 | D05 | BG1IN* | D13 |
| 7 | D06 | BG1OUT* | D14 |
| 8 | D07 | BG2IN* | D15 |
| 9 | GND | BG2OUT* | GND |
| 10 | SYSCLK | BG3IN* | SYSFAIL* |
| 11 | GND | BG3OUT* | BERR* |
| 12 | DS1* | BR0* | SYSRESET* |
| 13 | DS0* | BR1* | LWORD* |
| 14 | WRITE* | BR2* | AM5 |
| 15 | GND | BR3* | A23 |
| 16 | DTACK* | AM0 | A22 |
| 17 | GND | AM1 | A21 |
| 18 | AS* | AM2 | A20 |
| 19 | GND | AM3 | A19 |
| 20 | IACK* | GND | A18 |
| 21 | IACKIN* | SERCLK | A17 |
| 22 | IACKOUT* | SERDAT | A16 |
| 23 | AM4 | GND | A15 |
| 24 | A07 | IRQ7* | A14 |
| 25 | A06 | IRQ6* | A13 |
| 26 | A05 | IRQ5* | A12 |
| 27 | A04 | IRQ4* | A11 |
| 28 | A03 | IRQ3* | A10 |
| 29 | A02 | IRQ2* | A09 |
| 30 | A01 | IRQ1* | A08 |
| 31 | −12V | +5V STDBY | +12V |

TABLE I-continued

P1 CONNECTOR PINOUT

| PIN | ROW A | ROW B | ROW C |
|---|---|---|---|
| 32 | +5V | +5V | +5V |

TABLE II

P3 CONNECTOR PINOUT FOR THE TTC UNIT

| PIN# | ROW A | ROW B | ROW C |
|---|---|---|---|
| 1 | GND | D00(lsb) | SB11+ |
| 2 | GND | D01 | SB11− |
| 3 | −5.2v | D02 | SA11+ |
| 4 | GND | D03 | SA11− |
| 5 | GND | D04 | SB10+ |
| 6 | −2v | D05 | SB10− |
| 7 | GND | D06 | SA10+ |
| 8 | GND | D07 | SA10− |
| 9 | −5.2v | D08 | SB9+ |
| 10 | GND | D09 | SB9− |
| 11 | GND | D10 | SA9+ |
| 12 | −2v | D11 | SA9− |
| 13 | GND | D12 | SB8+ |
| 14 | GND | D13 | SB8− |
| 15 | −5.2v | D14 | SA8+ |
| 16 | GND | D15 | SA8− |
| 17 | GND | D16 | SB7+ |
| 18 | −2v | D17 | SB7− |
| 19 | GND | D18 | SA7+ |
| 20 | GND | D19 | SA7− |
| 21 | −5.2v | D20 | SB6+ |
| 22 | GND | D21 | SB6− |
| 23 | GND | D22 | SA6+ |
| 24 | −2v | D23 | SA6− |
| 25 | GND | D24 | SB5+ |
| 26 | GND | D25 | SB5− |
| 27 | −5.2v | D26 | SA5+ |
| 28 | GND | D27 | SA5− |
| 29 | GND | D28 | SB4+ |
| 30 | −2v | D29 | SB4− |
| 31 | GND | D30 | SA4+ |
| 32 | GND | D31 (msb) | SA4− |

TABLE III

P4 CONNECTOR PINOUT FOR THE TTC UNIT

| PIN# | ROW A | ROW B | ROW C |
|---|---|---|---|
| 1 | SB2+ | SA2+ | SA3+ |
| 2 | SB2− | SA2− | SA3− |
| 3 | SB3+ | −5.2v | SA1+ |
| 4 | SB3− | ILIM | SA1− |
| 5 | TRIG-OUT+ | −2v | SB1+ |
| 6 | TRIG-OUT− | −5.2v | SB1− |
| 7 | TRIG-IN+ | GND | +5v |
| 8 | TRIG-IN− | −2v | +5v |
| 9 | GND | −5.2v | +5v |
| 10 | GATE1+ | −5.2v | +5v |
| 11 | GATE1− | −5.2v | +5v |
| 12 | GATE2+ | GND | +5v |
| 13 | GATE2− | −2v | +5v |
| 14 | GND | −2v | +5v |
| 15 | START+ | −5.2v | +5v |
| 16 | START− | GND | +5v |
| 17 | GND | WRITE | GND |
| 18 | CKD+ | GND | ERROR |
| 19 | CKD− | −5.2v | BUSY |
| 20 | CKC+ | −5.2v | NOT-READY |
| 21 | CKC− | −2v | GND |
| 22 | CKB+ | GND | STOP+ |
| 23 | CKB− | −5.2v | STOP− |
| 24 | CKA+ | −5.2v | RESERVED1 |
| 25 | CKA− | −5.2v | RESERVED2 |
| 26 | −2v | GND | −2v |
| 27 | GND | SYSCLK+ | GND |
| 28 | GND | SYSCLK− | GND |
| 29 | −5.2v | GND | −5.2v |
| 30 | +18v | AGND | −18v |
| 31 | +18v | AGND | −18v |

TABLE III-continued

P4 CONNECTOR PINOUT FOR THE TTC UNIT

| PIN# | ROW A | ROW B | ROW C |
|---|---|---|---|
| 32 | +18v | AGND | −18v |

TABLE IV

P3 CONNECTOR PINOUT FOR THE INSTRUMENTS

| PIN# | ROW A | ROW B | ROW C |
|---|---|---|---|
| 1 | GND | D00(lsb) | GND |
| 2 | GND | D01 | GND |
| 3 | −5.2v | D02 | GND |
| 4 | GND | D03 | GND |
| 5 | GND | D04 | GND |
| 6 | −2v | D05 | GND |
| 7 | GND | D06 | GND |
| 8 | GND | D07 | GND |
| 9 | −5.2v | D08 | GND |
| 10 | GND | D09 | GND |
| 11 | GND | D10 | GND |
| 12 | −2v | D11 | GND |
| 13 | GND | D12 | GND |
| 14 | GND | D13 | GND |
| 15 | −5.2v | D14 | GND |
| 16 | GND | D15 | GND |
| 17 | GND | D16 | GND |
| 18 | −2v | D17 | GND |
| 19 | GND | D18 | GND |
| 20 | GND | D19 | GND |
| 21 | −5.2v | D20 | GND |
| 22 | GND | D21 | GND |
| 23 | GND | D22 | GND |
| 24 | −2v | D23 | GND |
| 25 | GND | D24 | GND |
| 26 | GND | D25 | GND |
| 27 | −5.2v | D26 | GND |
| 28 | GND | D27 | GND |
| 29 | GND | D28 | GND |
| 30 | −2v | D29 | GND |
| 31 | GND | D30 | GND |
| 32 | GND | D31(msb) | GND |

TABLE V

P4 CONNECTOR PINOUT FOR THE INSTRUMENTS

| PIN# | ROW A | ROW B | ROW C |
|---|---|---|---|
| 1 | SAXX+ | (GND) | SBXX+ |
| 2 | SAXX− | (GND) | SBXX− |
| 3 | (GND) | −5.2v | (GND) |
| 4 | (GND) | ILIM | (GND) |
| 5 | TRIG-OUT+ | −2v | (GND) |
| 6 | TRIG-OUT− | −5.2v | (GND) |
| 7 | TRIG-IN+ | GND | +5v |
| 8 | TRIG-IN− | −2v | +5v |
| 9 | GND | −5.2v | +5v |
| 10 | GATE1+ | −5.2v | +5v |
| 11 | GATE1− | −5.2v | +5v |
| 12 | GATE2+ | GND | +5v |
| 13 | GATE2− | −2v | +5v |
| 14 | GND | −2v | +5v |
| 15 | START+ | −5.2v | +5v |
| 16 | START− | GND | +5v |
| 17 | GND | WRITE | GND |
| 18 | CKD+ | GND | ERROR |
| 19 | CKD− | −5.2v | BUSY |
| 20 | CKC+ | −5.2v | NOT-READY |
| 21 | CKC− | −2v | GND |
| 22 | CKB+ | GND | STOP/RECONFIG+ |
| 23 | CKB− | −5.2v | STOP/RECONFIG− |
| 24 | CKA+ | −5.2v | RESERVED1 |
| 25 | CKA− | −5.2v | RESERVED2 |
| 26 | −2v | GND | −2v |
| 27 | GND | SYSCLK+ | GND |
| 28 | GND | SYSCLK− | GND |
| 29 | −5.2v | GND | −5.2v |
| 30 | +18v | AGND | −18v |
| 31 | +18v | AGND | −18v |

TABLE V-continued

| P4 CONNECTOR PINOUT FOR THE INSTRUMENTS | | | |
|---|---|---|---|
| PIN# | ROW A | ROW B | ROW C |
| 32 | +18v | AGND | −18v |

Figure 3:
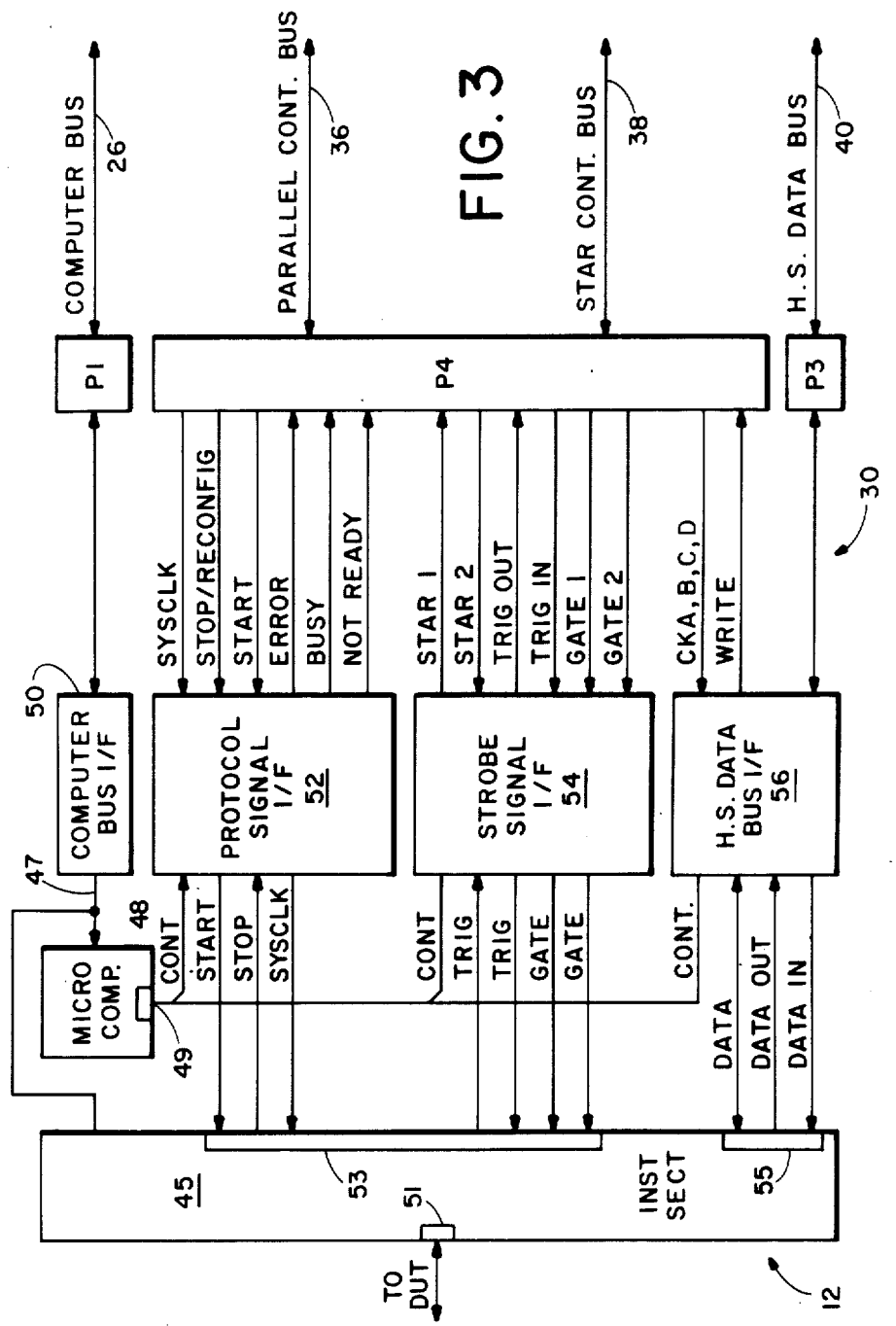
FIG. 3 is a block diagram of a typical computer-based instrument of FIG. 1.

Referring to FIG. 3, a typical instrument 12 of FIG. 1, depicted in block diagram form, includes an instrumentation section 45 for performing the test function of the instrument, and a microcomputer 48, including a microprocessor, memory, I/O ports and associated hardware for controlling the operation of the instrument section 45 according to stored instructions. The microcomputer 48 communicates with the instrumentation section 45 through a microcomputer bus 47. The instrumentation section 45 also include terminals 51 for connecting test lines to the device under test 14 via the signal conditioning circuits 15 of FIG. 1, terminals 53 for connecting input and output trigger, gate, start and stop signal lines, and terminals 55 for inputting or outputting test data to a high speed data bus. Many computer-based instruments having instrumentation sections 45 and microcomputers 49 as in FIG. 3 are known in the art, but according to the present invention, such instruments of the prior art are implemented on a circuit board for mounting in the system chassis slots, as described hereinabove, and are fitted with a system interface unit 30 for adapting the instrument for use within the computer-based instrument system of the present invention.

Interface unit 30 includes a section 50 for providing an interface between the microcomputer bus 47 and the computer bus 26. Unit 30 also includes a protocol interface, a section 52 for providing an interface between the instrument, and the lines of the parallel control bus 36 carrying the STOP/RECONFIG, START, ERROR, BUSY and NOT READY system protocol signals. The protocol signal interface section 52 also has provisions to buffer and forward the SYSCLOCK signal from the TTC to the instrumentation section 45 and to monitor an optional STOP signal input from the instrumentation section 45 indicating when test operation is complete.

Interface unit 30 also includes a strobe signal interface section 54 to detect one or more trigger signals from the instrumentation section 45 and to forward selected trigger signals on either the STAR 1 (SAXX) or TRIG OUT signal line to the TTC unit via star bus 38 or parallel bus 36. The strobe signal interface section 54 also receives the GATE 1 and GATE 2 signals from the control bus 36, and forwards them to the instrumentation section 45. The strobe signal interface section 54 is further adapted to buffer and multiplex the TRIG IN and STAR 2 (SBXX) signals from the TTC unit 32 onto trigger inputs of instrumentation section 45.

The interface unit 30 further includes a high speed bus interface section 56 for receiving the CKA, CKB, CKC, and CKD signals from the TTC unit 32, for transmitting the WRITE signal to the TTC unit over the control bus 36, and for interfacing the data I/O terminals 55 of the instrumentation section to the high speed data bus 40 via connector P3. The microcomputer 48 communicates with the protocol signal interface unit 52, the strobe signal interface unit 54 and the high speed bus interface unit 56 through the microcomputer parallel port 49.

Figure 4:
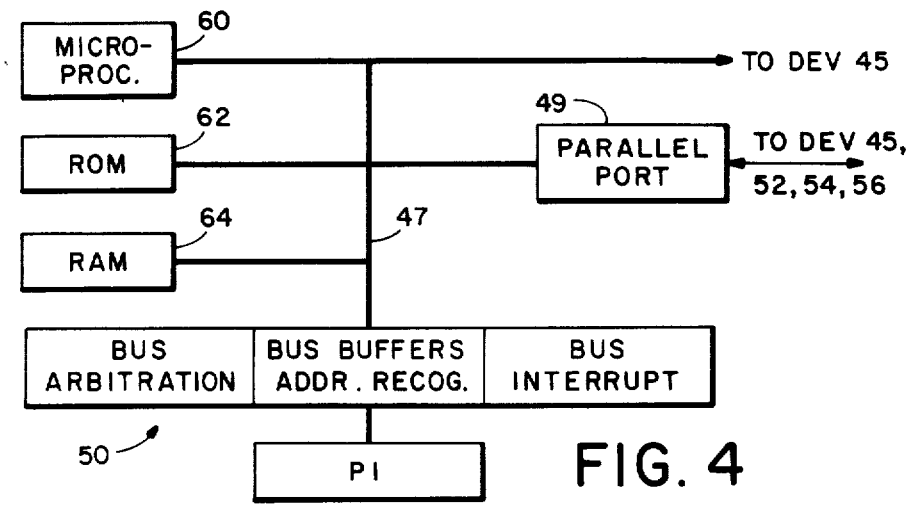
FIG. 4 is a more detailed block diagram of the microcomputer and the computer bus interface section of the instrument of FIG. 3.

The master controller 16 of FIG. 1 communicates with each instrument's microcomputer 48 over the computer bus 26 using direct memory access (DMA) data transfers and interrupts. Referring to FIG. 4, the microcomputer 48 and the control bus interface section 50 of FIG. 3 are depicted in more detailed block diagram form. The control bus interface section 50, including a bus buffer, address recognizer, interrupter, and arbitration circuitry, is adapted to provide appropriate interfacing for DMA data transfers between the microcomputer 48 and the master controller. Such interface circuitry depends on the requirements of the particular computer bus 26. For the VME bus, the interface circuitry 50 is well-known and is not further detailed herein. Microcomputer 48 includes a microprocessor 60, suitably a Motorola model 68010, a ROM 62, a RAM 64 and a parallel port 49. Microprocessor 60, ROM 62, RAM 64, port 49 and computer interface section 50 are all interconnected by bus 47 including data, address and control lines. Bus 47 is also brought out to instrumentation section 45.

Figure 5:
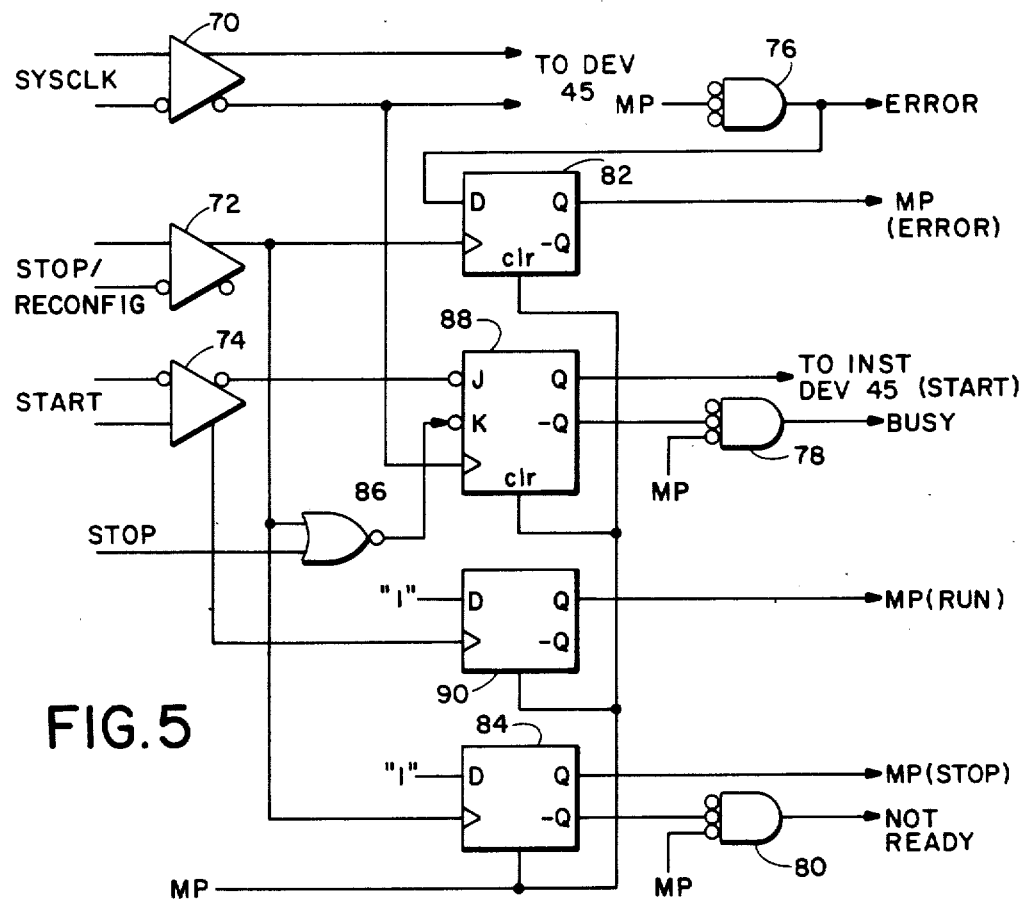
FIG. 5 is a schematic diagram of the protocol signal interface section of the FIG. 3 diagram.

Referring to FIG. 5, the protocol signal interface section 52 of FIG. 3, depicted in schematic diagram form, includes buffers 70, 72 and 74 for receiving the SYSCLK, STOP/RECONFIG, and START signals, respectively, from the TTC unit 32 along with AND gates 76, 78, and 80 for outputting the ERROR, BUSY and NOT READY signals, respectively, to the TTC unit over the parallel control bus. The STOP/RECONFIG signal output of buffer 72 is applied to the clock inputs of two type D flip-flops 82 and 84. A logic level "1" (high) is applied to the D input of flip-flop 84 while the Q output is supplied to the microcomputer 48 of FIG. 3 and the −Q output is applied to an inverting input of AND gate 80. A signal from microcomputer 48 is also applied to another inverting input of AND gate 80. When the TTC unit 32 initiates the STOP/RECONFIG command, flip-flop 84 is set and the −Q output thereof drives the output of AND gate 80 high to assert the NOT READY signal. When the microprocessor 48 senses the high Q output of flip-flop 84, it prepares the instrument 12 to perform another test procedure according to instructions from the master controller 16. After the instrument is reconfigured for the new test procedure, the microcomputer 48 transmits a pulse to the clear input of flip-flop 84, resetting the flip-flop. When the instrument is not involved in a particular test, the microprocessor may disable the NOT READY signal by asserting its input to AND gate 80.

AND gate 76 drives the ERROR control line of bus 36 and is in turn driven by an error indicating signal from microcomputer 48. The microcomputer 48 may be programmed to generate an error indicating signal following detection of an error in the instructions from the master controller or arising in the course of performing a test procedure. The ERROR signal is carried on the control bus to all instruments, and is applied to the D input of flip-flop 82. The Q output of flip-flop 82 is transmitted to the microprocessor 48. When the TTC unit initiates the STOP-RECONFIG signal while the ERROR signal on the control bus is high, flip-flop 82 is set and its Q output indicates to the microcomputer 48 that it should take appropriate error handling action according to previously stored instructions. This feature permits the instrument to be selectively programmed to perform an alternative course of action when an error is detected by one or more instruments in performing the previous test sequence. For instance, the instruments 12 may be programmed to repeat the previous test sequence rather than to execute a new test procedure. The flip-flop 82 is also reset by the clear signal for the microcomputer.

The STOP/RECONFIG signal and an internal STOP signal from the instrumentation section 45 are applied as inputs to a NOR gate 86 and the output of the NOR gate is applied to an inverting K input of a J-K flip-flop 88. The START signal from the TTC, inverted by buffer 74, is applied to an inverting J input of flip-flop 88. The Q output of flip-flop 88 is provided as an input to the microcomputer 48 and to the instrument 12 while the −Q output of flip-flop 88 drives an inverted input of AND gate 78 to produce the BUSY signal. Flip-flop 88 is clocked by the SYSCLK signal output of buffer 70 and is reset by the clear signal from the microprocessor. When the TTC unit asserts the START signal, flip-flop 88 is set on the falling edge of the next SYSCLK pulse and the −Q output thereof drives AND gate 78 high to turn on its BUSY signal output. The Q output of flip-flop 88 initiates instrument operation and indicates to the microcomputer 48 that the test sequence is in progress. When either the STOP/RECONFIG signal or the internal STOP signal from the instrument are asserted, flip-flop 88 is reset on the next SYSCLK pulse trailing edge by the resulting signal from NOR gate 86, thereby causing the BUSY signal output of AND gate 78 to go low. A signal from microcomputer 48 drives a second inverted input of AND gate 78 to disable the BUSY signal when the instrument is not in use.

The START signal output of buffer 74 is also applied as a clock input to another D type flip-flop 90 and a logical "1" is applied to the D input of the flip-flop. The Q output of the flip-flop 90 is applied as input to the parallel port of the microcomputer 48. When the Q output of flip-flop 90 goes high, indicating that the START signal has issued, the microcomputer begins executing test instructions.

The strobe signal interface unit 54 of FIG. 3 is arranged to suit the trigger signal input and output requirements for a wide variety of instruments 12 in the performance of many different test procedures. FIG. 6 is a schematic diagram of a typical such interface unit 54.

Trigger lines from multiple trigger sources in the instrumentation section 45 of FIG. 3 are applied in common as inputs to a pair of N to 1 multiplexers 92 and 94, the switching states of which are controlled by signals from the microcomputer 48 of FIG. 3. The output of multiplexer 92 is applied as an input to an OR gate 96 which produces the differential SAXX signal carried on the star bus to the TTC unit. The output of multiplexer 94 is applied to an OR gate 98 which produces a differential output, one line of which drives an inverted input of an AND gate 99 and the other line of which drives an inverted input of another AND gate 100. The outputs of AND gates 99 and 100 comprise the differential TRIG OUT signal to the TTC unit. The outputs of AND gates 99 and 100 may be disabled by a signal applied to other inverting inputs of the gates by microcomputer 48 of FIG. 3 when the instrument is not in use.

The GATE 1 signal is applied as an input to a differential buffer 102 which forwards the signal to the instrumentation section 45 of the instrument. Similarly, the SBxx signal from the TTC unit carried on the star bus and the TRIG IN signal from the TTC unit carried on the parallel control bus are buffered by other buffers 105 and 107 and transmitted to the instrumentation section 45 as trigger inputs thereto.

Referring to FIG. 7, the high speed data bus interface section 56, depicted in schematic diagram form, includes a tri-state buffer 110 for transmitting data from the instrumentation section 45 of FIG. 3 to the high speed data bus 40 and another tri-state buffer 118 for transmitting data from the high speed data bus to the instrumentation section via a latch 120. The CKB, CKC and CKD timing signals from the TTC unit are applied to an A input of an A=B comparator 103 while reference data from a latch 104 provided by microprocessor 48 of FIG. 3 is applied to a B input of the comparator. The inverted output of the comparator (high when the A input does not equal the B input) is applied to the D input of a D type flip-flop 106, the Q output of which is applied to an inverting input of an OR gate 108. The output of the OR gate 108 comprises the WRITE signal transmitted on the control bus to the other instruments in the system. The CKA signal from the TTC unit clocks the operation of flip-flop 106. The operation of comparator 103 is enabled by a signal from the Q output of a D type flip-flop 112, the D input of which is driven by a signal from the microcomputer 48. Flip-flop 112 is clocked by a DATA READY signal from the instrumentation section 45 of FIG. 3 when it is ready to transmit data. When the D input to flip-flop 112 is held high by the microcomputer, flip-flop 112 sets, thereby enabling comparator 103. When the CKB-CKD signals match the reference signal stored in latch 104, the D input to flip-flop 106 is driven low, resetting flip-flop 106 on occurrence of the next CKA pulse, thereby driving the WRITE signal output of OR gate 108 high. The −Q output of flip-flop 106 drives the control input of buffer 110, causing the data to be placed on the high speed data bus. When the CKB-CKD signals increment at the end of the current SYSCLK cycle, the output of comparator 103 is driven high, setting flip-flop 106 and turning off the WRITE signal and buffer 110.

The CKB-CKD signals are also applied to the A input of another A=B comparator 114 while slot reference data from microprocessor 48 of FIG. 3 is stored in another latch 116 and applied as the B input to the comparator 114. Comparator 114 is enabled by the WRITE signal. The output of comparator 114 drives the control input of buffer 118 to transmit data carried on the high speed bus 40 from another instrument to latch 120. The output of comparator 114 also comprises one input of an AND gate 119 while the CKA signal comprises another input. The output of AND gate 119 clocks the latch 120 input. When the current high speed data bus slot matches the reference data in latch 116, comparator 114 turns on buffer 118 to apply the data currently on bus 118 to latch 120. On the next CKA pulse, latch 120 is input enabled so that the data is stored therein and transmitted to the instrumentation section 45 of the instrument. The output of gate 119 is also transmitted to the instrumentation section to indicate that valid data is being transmitted to it.

Figure 8:
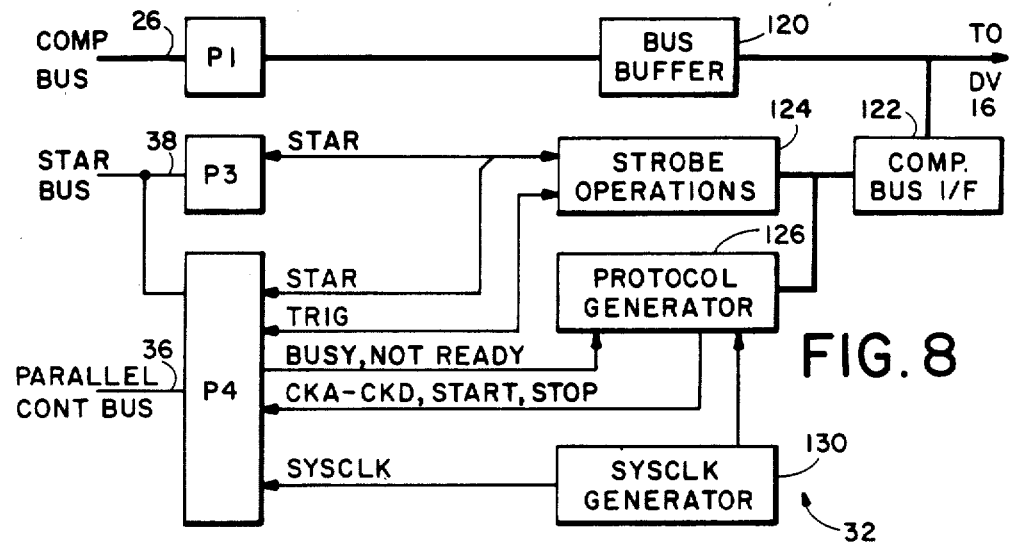
FIG. 8 is a block diagram of the trigger, timing and control unit of the FIG. 1 system.

Referring to FIG. 8, the TTC unit 32 of FIG. 1, depicted in block diagram form, comprises a connector P1 for connecting the TTC unit to the computer bus 26, a connector P3 for connecting the TTC unit to portions of the star bus 38, and a connector P4 for connecting the TTC unit to the parallel control bus 36 and to the remaining portions of the star bus. A bus buffer 120, similar to buffer 28 of the master controller 16, forwards the computer bus to the instruments 12 over the chassis backplane and also to a computer bus interface section 122 of the TTC unit which provides for data flow between the master controller 16 and a strobe operations sections 124, and a protocol generator 126 of the TTC unit 32. The TTC unit also includes a generator for producing the 50 Mhz SYSCLK signal transmitted to the instruments via connector P4 and also to the protocol generator.

The protocol generator 126 receives the BUSY, NOT READY, and ERROR signals from the instruments and transmits the START, STOP/RECONFIG, CKA, CKB, CKC and CKD signals to the instruments via connector 4 and the control bus 36. The strobe operations section 124 receives the SAxx and TRIG OUT signals from the instruments via the star bus 38 and the parallel control bus 36 and transmits the SBxx and TRIG IN signals to the instruments over the same busses.

Referring to FIG. 9, the protocol generator 126 of FIG. 8, depicted in combined block and schematic diagram form, includes a programmable counter 132 having a four-bit output, each bit being applied as an input to a separate one of the buffers 134, 136, 138 and 140, the outputs of which comprise the CKA, CKB, CKD and CKD signals, respectively. The counter counts SYSCLK pulses generated by the clock generator 130 of FIG. 8 when enabled by a signal from master controller 16 (MC) 120 of FIG. 1. On the first SYSCLK pulse after being enabled, another output of the counter drives the START signal output of another buffer 142 high for one clock cycle. On the first SYSCLK pulse after the master controller terminates the enabling signal to the counter 132, the remaining output drives the STOP/RECONFIG output signal of still another differential buffer 144 high for one clock cycle. Prior to commencing a test sequence, the master controller may set the count limit of the counter from 000 up to 111 (binary) by placing appropriate count limit data in a register within the counter. If, for instance, there are to be two competing uses for the high speed bus during the next test sequence, the count limit may be set to 001 so that the CKB-CKD data lines alternate between a 000 pattern and a 001 pattern, thereby indicating two separate time slots for data flow on the high speed bus. A total of eight different high speed data transmissions between selected instruments in the system may be arbitrated by setting the count limit in counter 132 up to 111. The instruments involved in each high speed data transmission are programmed to transmit or receive data only during an assigned time slot indicated by the state of the CKB-CKD signals.

The protocol generator 126 also includes a set of three buffers 143, 145, and 146 for receiving the differential BUSY, NOT-READY and ERROR signals, respectively, and outputting a logically equivalent non-differential signal. The BUSY signal output of buffer 143 is applied to a clock input of a type D flip-flop 148 while the NOT-READY output signal of flip-flop 145 is applied to a clock input of another type D flip-flop 150. A logical "1" source drives the D input of both flip-flops such that the flip-flops set when the BUSY or NOT READY signal inputs are momentarily high. The Q outputs of flip-flops 148 and 150, and the BUSY, NOT READY and ERROR signal outputs of buffers 143, 145, and 146 are all connected to the master controller via a buffering circuit 152. The Q outputs of flip-flops 148 and 150 are also connected to inputs of an OR gate 154, the output of which drives a bus interrupt input to the master controller. When the BUSY signal goes low, indicating that all instruments have completed their tasks during the current test sequence, or when the NOT READY signal goes low, indicating that all instruments are ready to perform the next test sequence, the interrupt signal output of OR gate 154 is driven high. Thereafter the master controller reads the data output of buffer 152 to determine the cause of the interrupt and the current state of the BUSY, NOT READY and ERROR signals, and then resets flip-flops 148 and 150 via a control line connected to the reset inputs thereof.

Figure 10:
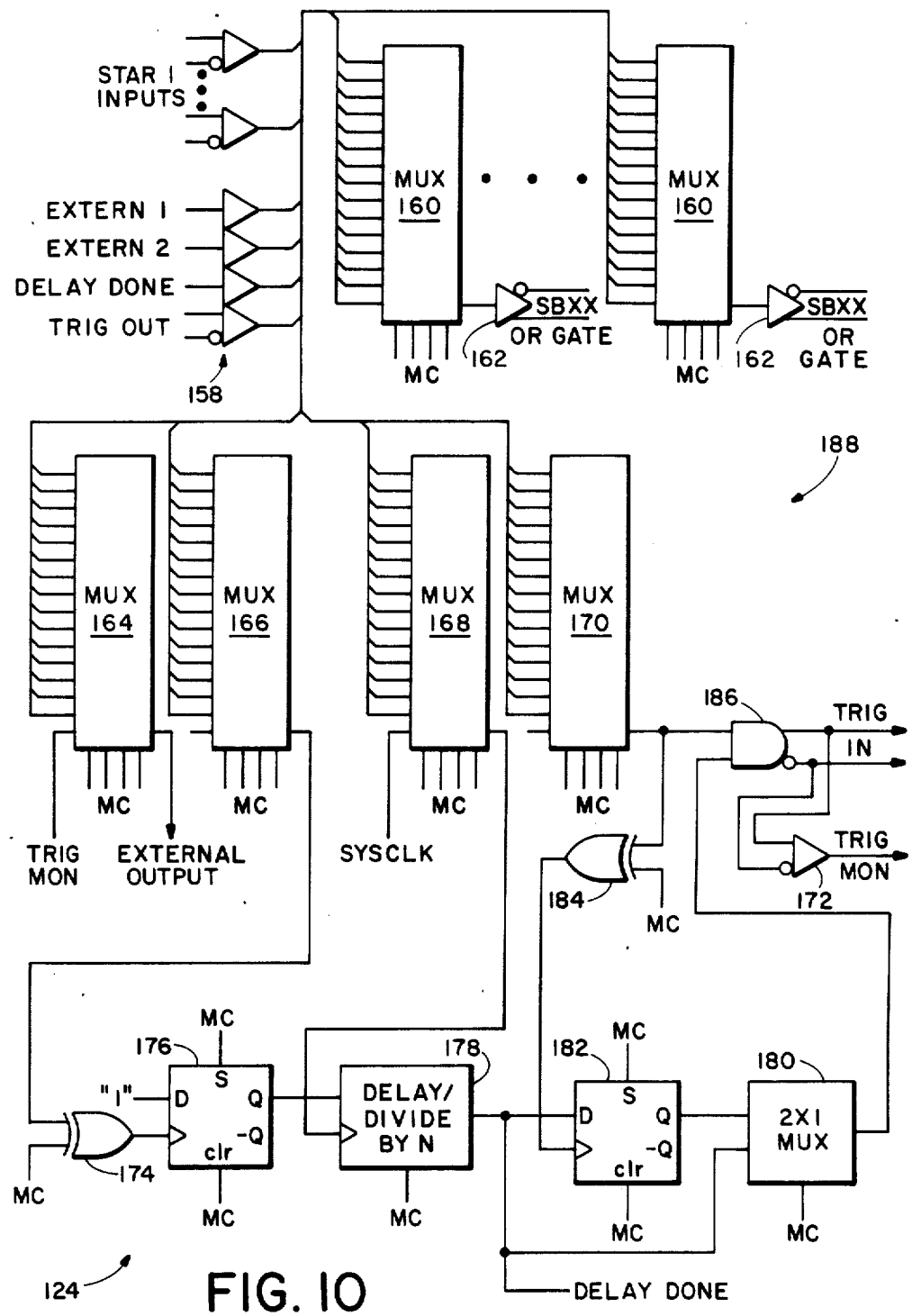
FIG. 10 is a schematic diagram of the strobe operations unit of the FIG. 8 circuit.

Referring to FIG. 10, the strobe operation section 124 of FIG. 8, depicted schematic diagram form, includes a set of fifteen buffers 158 connected to receive the eleven SAxx output signals associated with the eleven instrument slots on the system backplane, the single TRIG-OUT signal from the backplane, two external trigger signal inputs EXTERN 1 AND EXTERN 2, and an internally generated DELAY DONE signal (described hereinbelow). The output signals of buffers 158 drive separate inputs of each of thirteen 16×1 multiplexers 160. The output of each multiplexer 160 is connected to the input of a separate one of thirteen differential buffers 162 and the output of each buffer 162 drives a separate one of the eleven SBxx signals of the star bus or drives one of the the GATE 1 or GATE 2 signals of the control bus. The switching state of each multiplexer 160 is controlled by signals from the master controller. Thus the strobe operations section 124 of the TTC unit 32 permits any selected one of the SBxx or GATE 1 or 2 signals to the instruments 12 to be driven by any selected one of the SAxx or the TRIG-OUT signals from the instruments, by one of two external trigger signal inputs, or by the DELAY DONE signal.

The outputs of buffers 158 are also applied as inputs to a set of four other 16×1 multiplexers 164, 166, 168 and 170 having switching states also controlled by the master controller. The SYSCLK signal provides another input to multiplexer 168 while a TRIG MON signal, comprising the TRIG-IN signal buffered by a buffer 172, provides another input to multiplexer 164. The output of multiplexer 164 comprises an external output of the test system which may be utilized for monitoring the state of any one of the STAR 1, TRIG-IN, TRIG-OUT, DELAY-DONE, or external trigger sources. The output of multiplexer 166 is applied as an input to an XOR gate 174 along with a control signal from the master controller. The output of XOR gate 174 drives the clock input of a type D flip-flop 176, which may be set or cleared by signals from the master controller. A logical "1" is applied to the D input of flip-flop 176. The Q output of flip-flop 176 drives an enabling input of a programmable, delay/divide by N counter 178 where N is an integer determined by signals from the master controller. Counter 178 counts output pulses from multiplexer 168. The output of counter 178, comprises the DELAY DONE signal applied as an input to multiplexers 162, and also applied as an input to a 2×1 multiplexer 180 as well as to the D input of another type D flip-flop 182. The Q output of flip-flop 182 is connected to another input of multiplexer 180.

The output of multiplexer 170 drives one input of another XOR gate 184 while a signal from the master controller drives another XOR gate input. The output of XOR gate is applied to the clock input of flip-flop 182. The switching state of multiplexer 180 is controlled by a signal from the master controller. The output of multiplexer 180 and multiplexer 170 are connected to inputs of an AND gate 186 which produces the TRIG-IN signal.

The circuit of FIG. 10 permits the TRIG-IN signal to be asserted in a variety of ways. The TRIG-IN signal is asserted when both inputs to AND gate 186 (the outputs of multiplexers 170 and 180) are high. Since the output of multiplexer 170 is any selected one of the input trigger signals from buffers 158, the TRIG-IN signal is asserted on occurrence of a selected one of these input trigger signals, provided AND gate 186 is enabled by the output of multiplexer 180. The output of multiplexer 180 may be driven high under a variety of circumstances. In one switching state, the output of multiplexer 180 is directly controlled by the output of counter 178. Counter 178 counts occurrences of a selected one of the trigger or SYSCLK inputs to multiplexer 168. Therefore the TRIG-IN signal may be asserted on the first occurrence of one selected trigger input signal after N occurrences of a second (or the same) selected input signal. Gate 174 and flip-flop 176 control the count enabling of counter 178. Thus the count of the second trigger signal may be programmed to begin only after assertion of selected trigger signal from multiplexer 166. The state of the master controller input to XOR gate 174 determines whether the rising or falling edge of the trigger signal clocks flip-flop 176. The counter 178 may also be utilized to assert the DELAY-DONE trigger signal a selected number of SYSCLCK pulses after the counter is enabled by a trigger signal via multiplexer 166. The DELAY-DONE signal may then initiate a selected TRIG-IN, STAR 1 or GATE signal by appropriately switching multiplexers 160 or 170.

The TRIG-IN output of AND gate 186 may also be enabled by the Q output of flip-flop 182 via multiplexer 180 according to the selected switching state of multiplexer 180. Flip-flop 182 may be set when clocked by the output of XOR gate 184, provided the output of counter 178 is high. The output of XOR gates goes high on the rising or falling edge of the output signal from multiplexer 170, depending on the state of the control signal from the master controller applied to XOR gate 184, and is further qualified by the output of counter 178.

Thus the strobe operations section 124 of FIG. 10 permits the TRIG IN, SBxx and GATE signals to be asserted in a flexible manner according to selected combinations of input TRIG OUT, SAxx, external trigger, and SYSCLK signal events, such combinations being software selectable by data from the master controller of the TTC unit 32. The flexibility of the trigger signal logic and routing provided by the strobe operations section and the use of the star and parallel trigger busses interconnecting the instruments 12 and the TTC unit 32 permit selected instruments to perform a wide variety of tests without requiring custom trigger signal interconnects for each test.

Figure 11:
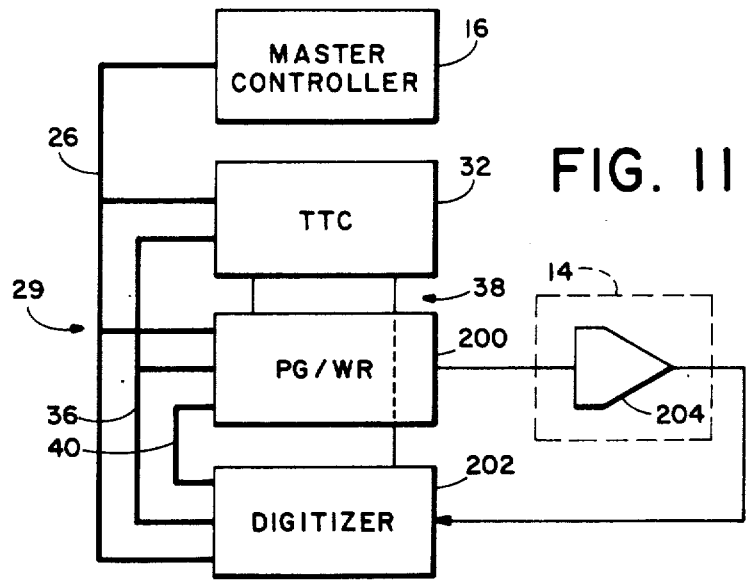
FIG. 11 is a block diagram of the computer-based instrument system of the present invention adapted to perform an examle test procedure.

Referring to FIG. 11, the operation of the computer-based instrument system of the present invention is illustrated by an example test procedure wherein a pattern generator/word recognizer (PG/WR) 200 and a digitizer 202 are operated in concert to test the performance of a device under test 14, in this case a digital-to-analog converter (DAC) 204. The PG/WR, the digitizer and the TTC unit 32 are interconnected by the system backplane 29 which includes the parallel control bus 36, the star bus 38, the computer bus 26 and the high speed data bus 40 as described hereinabove. The computer bus 26 is also connected to the system controller 16. The test involves applying a sequence of data patterns to the input of the DAC 204 and then, after a selected response time following application of a data pattern to the DAC, comparing the digitized output of the DAC with the expected output to determine the accuracy of DAC operation within allowed response time.

Figure 12:
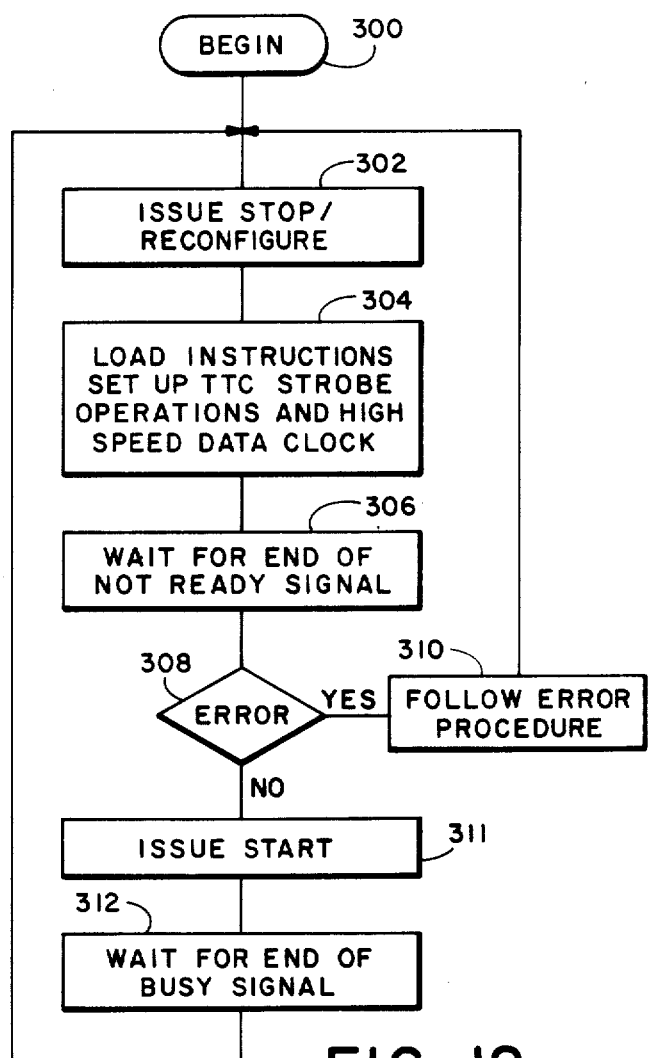
FIG. 12 is a flowchart of a program for controlling the operation of the master controller of the system of FIG. 11.

FIG. 12 is a flow chart of a program for operating the master controller 16 of FIG. 11 for performing the example test procedure. Beginning in block 300 program flow passes to block 302 where the TTC unit is commanded to issue the STOP/RECONFIG signal to the instruments, causing the instruments to assert the NOT READY signal, and to prepare to accept instructions for the next test. Then in block 304, test instructions are transmitted to each instrument over the computer bus, the appropriate trigger signal routing is set in the TTC unit, and the operation of the high-speed data clock is set for the appropriate number of time slots. Next, in block 306, the master controller waits until the TTC unit determines that the instruments have deasserted the NOT READY signal, indicating that they have reconfigured according to the instructions from the master controller and are ready to perform the test.

In block 308, the master controller then checks to see if the TTC unit detected an error signal from one of the instruments indicating, perhaps, an error in the set up instructions. If an error signal was detected, the program proceeds to block 310 where appropriate action is taken, such as displaying an error indication message. The program then returns to block 302 where the TTC unit is commanded again to repeat the STOP/RECONFIG signal. In the meantime the instruments have cleared the error signal and prepare to receive new instructions. When the ERROR signal is not asserted by an instrument, program flow passes from block 308 to block 311 where the master controller enables the counter 132 of FIG. 9, which transmits START to the instruments, causing the instruments to begin the test procedure and to assert the BUSY signal.

Next, in block 312 the master controller waits until the TTC unit detects the end of the BUSY signal indicating that the instruments have completed the test process. Return is then made to block 302 wherein the count output of counter 132 of the TTC unit is disabled, at which point the counter asserts the STOP/RECONFIG signal causing the instruments to prepare for another test.

Figure 13:
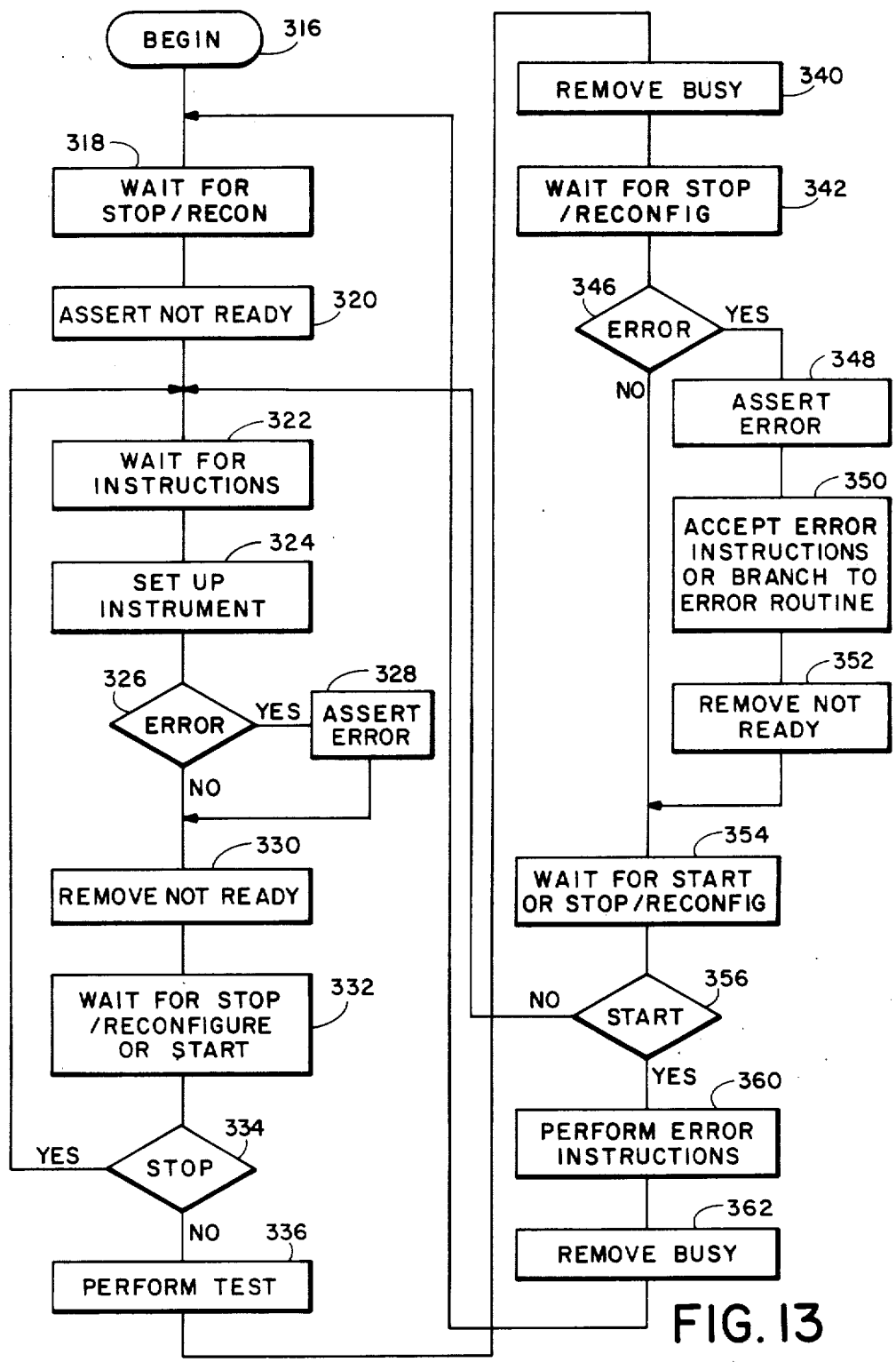
FIG. 13 is a flowchart of a program for controlling the operation of microcomputers in the instruments of the system of FIG. 11.

The operation of the microcomputer 48 in each instrument may be programmed according to the flow chart of FIG. 13. Beginning in block 316, the program is directed to block 318 where the instrument waits for the STOP/RECONFIG signal from the TTC unit. On receipt of the STOP/RECONFIG signal the interface hardware in each instrument asserts the NOT READY signal which is detected by the microcomputer in the instrument. The procedure then moves to block 322 where the microcomputer waits for instructions from the master controller. Then in block 324 the microcomputer in each instrument sets up the operating parameters of the instrument according to the instructions received. Next, in block 326, if the instructions contain an error, program flow is directed to block 328 where the ERROR signal is asserted. The program then proceeds to block 330. If no error is detected, program flow passes directly from block 326 to block 330.

In block 330, the NOT READY signal is deasserted, and then, in block 332, the microprocessor waits until it receives a STOP/RECONFIG or a START signal. The STOP/RECONFIG signal will be sent if one of the instruments initiated the ERROR signal in block 328. In such case, the program returns from block 334 back to block 322 and the microcomputer waits for further instructions from the master controller. If no ERROR occurred, the master controller causes the TTC unit to assert the START signal causing the instrument to begin the test on occurrence of the next SYSCLK signal. In such case, the instrument interface hardware asserts the BUSY signal and program passes from block 334 to block 336 where the microprocessor performs such functions as may be required during the test. When the microprocessor determines that the test procedure is complete, it deasserts the BUSY signal in block 340. Next, in block 342, the microprocessor waits until the TTC unit asserts the STOP/RECONFIG signal.

If the microprocessor detected an ERROR during performance of the test, program flow is then directed by block 346 to block 348 where the ERROR signal is asserted and then to block 350 where the microprocessor asserts the NOT READY signal and waits for error instructions from the master controller. When error instructions are received, the program proceeds to block 352 where the NOT READY signal is deasserted. However, if no error was detected, the procedure goes directly from block 346 to block 354. In block 354 the microcomputer waits for a START signal or a STOP/RECONFIG signal. If a START signal is received, then in block 356 flow is directed to block 360 where the interface hardware asserts the BUSY signal and the microprocessor performs the ERROR handling routine sent by the master controller in block 350. When the routine is finished, the BUSY signal is removed in block 362 and the program flow returns to block 318. If no error was detected in block 346, then the master controller will initiate a STOP/RECONFIG signal in block 354 and block 356 will direct the program back to block 322 where the processor waits for further instructions from the master controller for performing a next test sequence.

The computer-based instrument system of the present invention thus provides for permanent interconnection of a plurality of instruments through common backplane wiring to provide programming access to each instrument, as well as flexible triggering, timing, control and high speed data bus interconnections between the instruments. This backplane wiring permits the instruments to be programmed for performing various aspects of a selected procedure from a common input terminal, permits close synchronization of the operation of the separate instruments in performing the procedure, and permits high speed transfer of data between instruments in the course of such procedure.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An apparatus for controlling and coordinating operations of a plurality of instruments in cooperative performance of a procedure, each instrument being configured to perform a portion of said procedure by an associated instrument computer in accordance with a set of configuration instructions and to generate first control signals and to respond to second control signals, said first and second control signals coordinating operations of said instruments in the course of performing said procedure, the apparatus comprising:
   master controller means for generating configuration instructions for each instrument computer;
   timing controller means responsive to said first control signals for generating said second control signals;
   a first bus, interconnecting the instrument computer associated with each said instrument to said master controller means, for carrying said configuration instructions to each said instrument computer; and
   a second bus, connecting each said instrument to said timing controller means, for carrying said first and second control signals between each said instrument and said timing controller means.

2. The apparatus of claim 1 wherein said second control signals include a stop/reconfigure signal indicating when the instrument computer associated with each instrument is to configure the instrument to perform its portion of said procedure according to said configuration instructions.

3. The apparatus of claim 2 wherein said first control signals include a signal continuously asserted by each said instrument following receipt of said stop/reconfigure signal until the instrument has been configured according to said configuration instructions.

4. The apparatus of claim 1 wherein said second control signals include a signal for clocking the performance of said procedure by each instrument.

5. The apparatus of claim 1 wherein said second control signals include a signal for starting the performance of said procedure by every instrument.

6. The apparatus of claim 1 wherein said first control signals include a busy signal asserted by each instrument when said instrument is performing its portion of said procedure.

7. The apparatus of claim 1 wherein at least one of said instruments may be configured to generate test data and at least one other of said instruments may be configured to receive and process said test data, said apparatus further comprising:
   a third bus, connected in parallel to each said instrument, for conveying said test data between said at least one instrument and said at least one other instrument.

8. The apparatus of claim 7 wherein said first and second control signals comprise signals for arbitrating conveyance of data on said third bus by said instruments.

9. An apparatus for controlling and coordinating operations of a plurality of instruments in cooperative performance of a procedure, each instrument being configured to perform a portion of said procedure by an associated instrument computer in accordance with a set of configuration instructions and to generate first control signals and to respond to second control signals, said first and second control signals coordinating operations of said instruments in the course of performing said procedure, the apparatus comprising:
   master controller means for generating configuration instructions for each instrument computer;

timing controller means responsive to said first control signals for generating said second control signals;

a first bus, interconnecting the instrument computer associated with each said instrument to said master controller means, for carrying said configuration instructions to each said instrument computer; and a second bus, connecting each said instrument to said timing controller means, for carrying said first and second control signals between each said instrument and said timing controller means, said first and second control control signals comprising a stop/reconfigure signal indicating when the instrument computer associated with each instrument is to configure the instrument to perform its portion of said procedure according to said configuration instructions, a not ready signal continuously asserted by each said instrument following receipt of said stop/reconfigure signal until the instrument has been configured according to said configuration instructions, a signal for clocking the operation of each instrument, a signal for starting the performance of said procedure portion by every instrument, and a busy signal asserted by each instrument when said instrument is performing its portion of said procedure.

10. The apparatus of claim 9 wherein said timing controller means comprises:

means for monitoring said busy and said not ready signals and for transmitting said stop/reconfigure signal, said starting signal, and said clocking signal on said second bus in response to said busy and said stop/reconfigure signals.

11. An apparatus for controlling and coordinating operations of a plurality of instruments in cooperative performance of a procedure, each instrument being configured to perform a portion of said procedure by an associated instrument computer in accordance with a set of configuration instructions and to generate first control signals and to respond to second control signals, said first and second control signals coordinating operations of said instruments in the course of performing said said procedure, the apparatus comprising:

master controller means for generating configuration instructions for each instrument computer;

timing controller means responsive to said first control signals for generating said second control signals;

a first bus, interconnecting the instrument computer associated with each said instrument to said master controller means, for carrying said configuration instructions to each said instrument computer; and a second bus comprising two lines associated with each instrument connected between said instrument and said timing controller means, one of said two lines carrying one of said first control signals generated by the instrument to said timing controller means and the other of said lines carrying one of said second control signals generated by said timing controller means to said instrument.

12. The apparatus of claim 11 further comprising:

a third bus connecting said instruments in parallel to said timing controller means, for conveying a portion of said first and said second control signals between said instruments and said timing controller means.

13. An apparatus for controlling and coordinating operations of a plurality of instruments in cooperative performance of a procedure, each instrument being configured to perform a portion of said procedure by an associated instrument computer in accordance with a set of configuration instructions and to generate first control signals and to respond to second control signals, said first and second control signals coordinating operations of said instruments in the course of performing said procedure, wherein at least one of said instruments may be configured to generate test data and at least one other of said instruments may be configured to receive and process said test data, said apparatus, the apparatus comprising:

master controller means for generating configuration instructions for each instrument computer;

timing controller means responsive to said first control signals for generating said second control signals;

a first bus, interconnecting the instrument computer associated with each said instrument to said master controller means, for carrying said configuration instructions to each said instrument computer; and a second bus comprising two lines associated with each instrument connected between said instrument and said timing controller means, one of said two lines carrying one of said first control signals generated by the instrument to said timing controller means and the other of said lines carrying one of said second control signals generated by said timing controller means to said instrument;

a third bus connecting said instruments in parallel to said timing controller means, for conveying a portion of said first and said second control signals between said instruments and said timing controller means; and a fourth bus, connected in parallel to each said instrument, for conveying said test data between said at least one instrument and said at least one other instrument.

14. An apparatus for performing a procedure comprising:

a plurality of instruments, each instrument being configured to perform a portion of said procedure and to generate first control signals and to respond to second control signals, said first and second control signals coordinating operations of said instruments in the course of performing said procedure;

a plurality of instrument computers, one instrument computer being associated with each instrument, each instrument being configured to perform a portion of said procedure by its associated instrument computer in accordance with a set of configuration instructions, each said instrument and its associated instrument computer being mounted on a common circuit board;

master controller means for generating configuration instructions for each instrument computer;

timing controller means responsive to said first control signals for generating said second control signals;

a chassis having means for mounting each said circuit board and having a set backplane conductors for interconnecting the circuit boards, said backplane conductors comprising a first bus for carrying configuration instructions generated by said master controller means to each said instrument and a second bus, including lines separately connecting each said instrument to said timing controller means, for carrying a first portion of said first and second control signals between each said instrument and said timing controller means.

15. The apparatus of claim 14 wherein said backplane conductors further comprise:
a third bus connecting said instruments to said timing controller means, for conveying a second portion of said first and said second control signals between said instruments and said timing controller means.

16. An apparatus for performing a test procedure comprising:
a plurality of instrument computers;
a plurality of test instruments for cooperatively performing said test procedure, each test instrument being configured to perform an operation comprising a separate portion of said procedure by an associated one of said instrument computers in accordance with a set of configuration instructions provided to the associated instrument computer, said test instruments being configurable to generate first control signals when performing said operations, operations of said test instruments being coordinated by second control signals transmitted to each of said test instruments;
master controller means for generating configuration instructions for each instrument computer prior to performance of said procedure;
timing controller means for receiving said first control signals and for generating said second control control signals in response to said first control signals during performance of said test procedure;
a first bus, connecting instrument computers associated with each said test instrument to said master controller means, said first bus carrying said configuration instructions to each said instrument computer; and
a second bus, connecting each said instrument in parallel to said timing controller means, for carrying said first and second control signals between said timing controller means and each said instrument.

17. An apparatus for performing a test procedure comprising:
a plurality of instruments, each instrument being configured to perform a portion of said procedure and to generate first control signals and to respond to second control signals, said first and second control signals coordinating operations of said instruments in the course of performing said procedure, wherein at least one of said instruments is configured to generate test data and at least one other of said instruments is configured to receive and process said test data;
a plurality of instrument computers, one instrument computer being associated with each instrument, each instrument being configured to perform a portion of said procedure by its associated instrument computer in accordance with a set of configuration instructions, each said instrument and its associated instrument computer being mounted on a common circuit board;
master controller means for generating configuration instructions for each instrument computer;
timing controller means responsive to said first control signals for generating said second control signals;
a chassis having means for mounting each said circuit board and having a set backplane conductors for interconnecting said circuit boards, said backplane conductors comprising a first bus for carrying configuration instructions generated by said master controller means to each said instrument computer and a second bus, including lines separately connecting each said instrument to said timing controller means, for carrying a first portion of said first and second control signals between each said instrument and said timing controller means, a third bus connecting said instruments in parallel to said timing controller means, for conveying a second portion of said first and said second control signals between said instruments and said timing controller means, and a fourth bus, connected in parallel to each said instrument, for conveying said test data between said at least one instrument and said at least one other instrument.

18. The apparatus of claim 17 wherein said first and second control signals comprise:
a stop/reconfigure signal indicating when the instrument computer associated with each instrument is to configure the instrument to perform its portion of said procedure according to said configuration instructions,
a signal continuously asserted by each said instrument following receipt of said stop/reconfigure signal until the instrument has been configured according to said instructions,
a signal for clocking the operation of each instrument,
a signal for starting the performance of said procedure portion by every instrument,
and a busy signal asserted by each instrument when said instrument is performing its portion of said procedure.

* * * * *